United States Patent
Yang

(10) Patent No.: US 7,839,105 B2
(45) Date of Patent: Nov. 23, 2010

(54) CIRCUIT INSTALLATION CAPABLE OF FULL VOLTAGE ACTIVATION, DIVISION VOLTAGE OPERATION AND DELAYED BREAKING

(76) Inventor: Tai-Her Yang, 6F-5 No. 250, Sec. 4, Chung Hsiao E. Rd., Taipei (TW)

( * ) Notice: Subject to any disclaimer, the term of this patent is extended or adjusted under 35 U.S.C. 154(b) by 445 days.

(21) Appl. No.: 11/526,585

(22) Filed: Sep. 26, 2006

(65) Prior Publication Data

US 2008/0074078 A1    Mar. 27, 2008

(51) Int. Cl.
*H02K 7/10* (2006.01)
*H02K 17/32* (2006.01)
*H02K 23/68* (2006.01)
*H02K 27/30* (2006.01)
*H02P 29/04* (2006.01)
*H02J 7/00* (2006.01)

(52) U.S. Cl. ............... 318/364; 318/362; 318/365; 320/166; 320/167

(58) Field of Classification Search ............ 320/166, 320/167, 126; 307/109; 318/364
See application file for complete search history.

(56) References Cited

U.S. PATENT DOCUMENTS

| 4,677,537 | A | * | 6/1987 | Chonan | 363/126 |
| 5,345,161 | A | * | 9/1994 | Zieve | 320/166 |
| 5,642,269 | A | * | 6/1997 | Kanouda et al. | 363/20 |
| 5,646,460 | A | * | 7/1997 | Bocchiola et al. | 307/109 |
| 5,675,239 | A | * | 10/1997 | Kim et al. | 323/273 |
| 6,291,951 | B1 | * | 9/2001 | Baulier | 318/363 |
| 6,801,018 | B2 | * | 10/2004 | Kranister et al. | 320/166 |

* cited by examiner

*Primary Examiner*—Edward Tso
*Assistant Examiner*—Ahmed Omar
(74) *Attorney, Agent, or Firm*—Bacon & Thomas, PLLC

(57) ABSTRACT

A circuit installation that executes full voltage activation, division voltage operation, and delayed breaking brake to electric load by increasing the power to the load activated to promote its activation performance or reducing operation power in the course of operation by the load to save power consumption or limit operation performance of the load.

5 Claims, 3 Drawing Sheets

CIRCUIT INSTALLATION CAPABLE OF FULL VOLTAGE ACTIVATION, DIVISION VOLTAGE OPERATION AND DELAYED BREAKING

BACKGROUND OF THE INVENTION (a) Field of the Invention

The present invention is related to a circuit installation, and more particularly, to one that controls a power load taking advantage of charging, discharging and division voltage features of capacitor to provide activation and operation features different from those provided by a conventional ON-OFF switch.

(b) Description of the Prior Art

The pattern of control and operation of an electric load by conventional power switches usually involves ON or OFF only without the capacity to change the input voltage to the load.

SUMMARY OF THE INVENTION

The primary purpose of the present invention is to provide a circuit installation that is capable of full voltage activation, division voltage operation and delayed breaking. To achieve the purpose, the present invention by taking advantage of the features of a capacitor that integral boosting voltage in charging and differential dropping voltage in discharging connects the capacitor in series with an electric load; two sets of the said capacitor connected in series and the device of electric load are then connected in series in opposite sequence before being connected in parallel; and a diode is connected in series in positive direction at where between two sets of electric loads according to the flowing direction of currents from both sets of electric load. Upon inputting DC power to charge the capacitor through the electric load thus to subject both electric loads respectively connected in series to the capacitor in the series circuits to 100% voltage; and later the charging voltage at the capacitor rises to create balanced division voltage respectively between both electric loads connected in parallel with the capacitor. At such time, both electric loads in the series circuits are in the status of series high resistance and low amperage to achieve the purposes of full voltage activation, division voltage operation, and delayed breaking. The electric load includes EM effect load or resistance load.

DETAILED DESCRIPTION OF THE PREFERRED EMBODIMENTS

Figure 1:
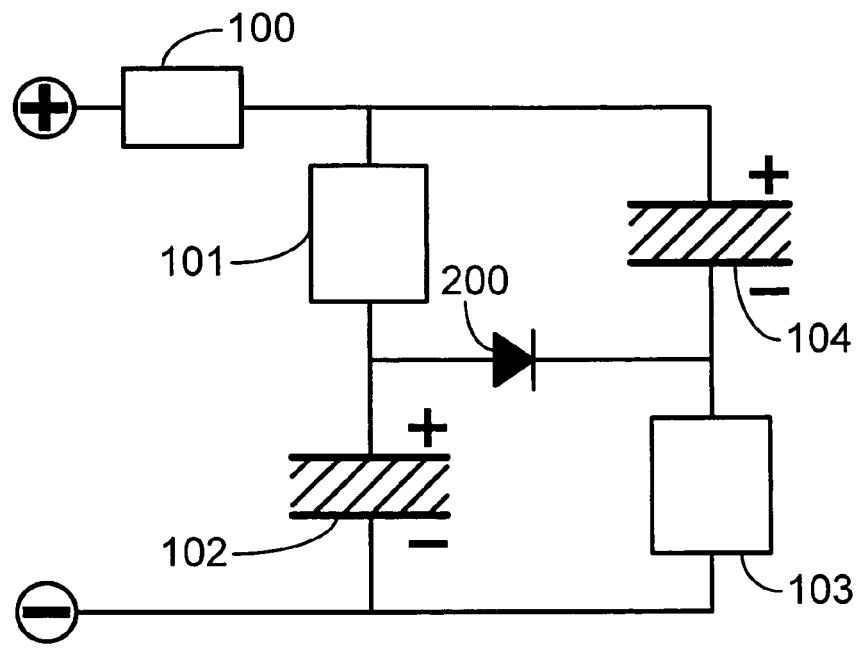
FIG. 1 is a schematic view showing a circuit of the present invention.

Referring to FIG. 1, a preferred embodiment of the present invention is comprised of:

EM effect electric loads 101, 103, each related to an electric drive installation giving various features depending on the voltage, e.g., an EM effect installation or an installation converting EM force into mechanical energy;

the first EM effect electric load 101, provided to constitute a first series circuit by connecting in series with a first capacitor 102 in the same direction of polarity;

a second capacitor 104, provided to constitute a second series circuit by connecting in series with the second EM effect electric load 103 in the same direction of polarity;

both capacitors 102, 104 and devices of both EM effect electric loads 101, 103 in the first and the second series circuits are connected in series in opposite sequence before being connected in parallel indicating the same polarity to be subject to control by a source switch 100; and a diode 200, coupled to where between the coupling point of the first EM effect electric load 101 and the first capacitor 102 in the first series circuit and that of the second EM effect electric load 103 and the second capacitor 104 in the second series circuit and indicating series in the same direction of polarity with the first and the second EM effect electric loads 101, 103 to permit flow of DC power.

Wherein, the operation function of the present invention as illustrated in FIG. 1 involves (1) With the source switch 100 is ON, DC power charges the first capacitor 102 via the first EM effect electric load 101 and charges the second capacitor 104 via the second EM effect electric load 103; meanwhile, both of the first and the second EM effect electric loads 101, 103 are subject to 100% voltage and the voltage gradually drops at each of the first and the second EM effect electric loads 101, 103 due to that the charging voltage respectively at the first and the second capacitors 102, 104 indicates integral curve rising status.

(2) When the voltage of the electric load drops and gets stabilized at the series division voltage values of the first and the second EM effect electric loads 101, 103, the amperage drops to where equal to the difference of DC source voltage less the voltage VF of the diode 200 in the same direction to be divided by the series resistance value of the first and the second EM effect electric loads 101, 103.

(3) With the source switch 100 is OFF or during transient drop of source voltage, the first capacitor 102 discharges the second EM effect electric load 103 and the second capacitor 104 discharges the first EM effect electric load 101 to delay the time for circuit breaking.

In the circuit illustrated in FIG. 1, the time of voltage drop at the first and the second EM effect electric loads 101, 103 in the course of feeding the power, or the time of extended circuit breaking may have its time constant regulated by having both ends of the first and the second capacitors 102, 104 to respectively connect in parallel with a first and a second resistances 105, 106.

Figure 2:
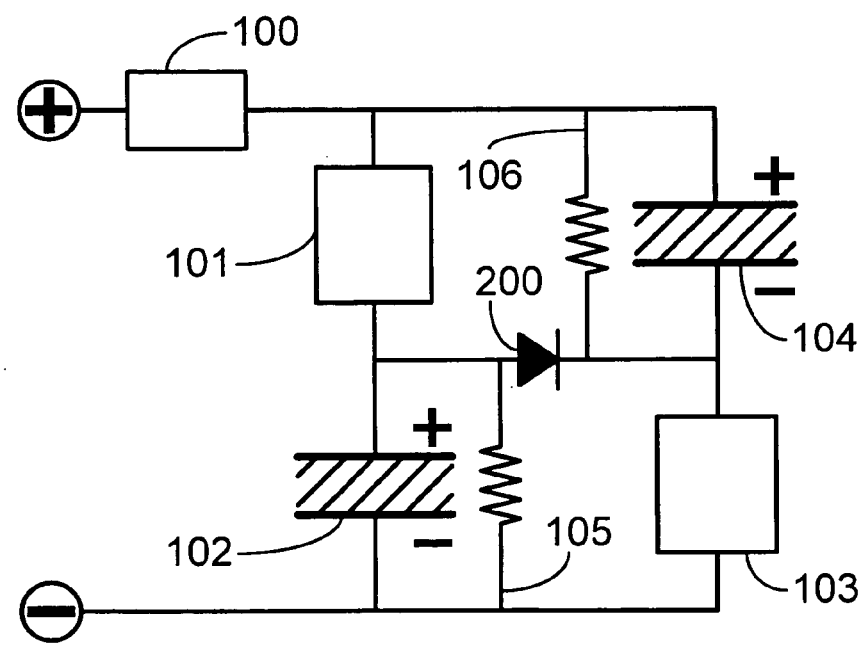
FIG. 2 is a schematic view showing that the circuit of the present invention in FIG. 1 is provided with additional resistance.

FIG. 2 shows another preferred embodiment of the present invention with an additional resistance added to the circuit of the preferred embodiment illustrated in FIG. 1. The second preferred embodiment is comprised of:

EM effect electric loads 101, 103, each related to an electric drive installation giving various features depending on the voltage, e.g., an EM effect installation or an installation converting EM force into mechanical energy;

the first EM effect electric load 101, provided to constitute a first series circuit by connecting in series with a first capacitor 102 in the same direction of polarity;

a second capacitor 104, provided to constitute a second series circuit by connecting in series with the second EM effect electric load 103 in the same direction of polarity;

both capacitors 102, 104 and devices of both EM effect electric loads 101, 103 in the first and the second series circuits are connected in series in opposite sequence before being connected in parallel indicating the same polarity to be subject to control by a source switch 100; and the diode 200, coupled to where between the coupling point of the first EM effect electric load 101 and the first capacitor 102 in the first series circuit and that of the second EM effect electric load 103 and the second capacitor 104 in the second series circuit and indicating series in the same direction of polarity with the first and the second EM effect electric loads 101, 103 to permit flow of DC power;

the first resistance 105, comprised of resistance impedance, or any coils containing resistance impedance, or power driven installation or device containing resistance impedance; connected in parallel with both ends of the first capacitor 102 to facilitate the discharging rate at the first capacitor 102 when the division voltage at the second EM effect electric load 103 drops or is interrupted; and the second resistance 106, comprised of resistance impedance, or any coils containing resistance impedance, or power driven installation or device containing resistance impedance; connected in parallel with both ends of the second capacitor 104 to facilitate the discharging rate at the second capacitor 104 when the division voltage at the first EM effect electric load 101 drops or is interrupted.

The operational function of the preferred embodiment illustrated in FIG. 2 involves:

(1) With the source switch 100 is ON, DC power charges the first capacitor 102 via the first EM effect electric load 101 and charges the second capacitor 104 via the second EM effect electric load 103; meanwhile, both of the first and the second EM effect electric loads 101, 103 are subject to 100% voltage and the voltage gradually drops at each of the first and the second EM effect electric loads 101, 103 due to that the charging voltage respectively at the first and the second capacitors 102, 104 indicates integral curve rising status; the first resistance 105 connected in parallel with the first capacitor 102 and the second resistance 106 connected in parallel with the second capacitor 104 extend the time of voltage drop respectively at the first and the second EM effect electric loads 101, 103.

(2) When the voltage of the electric load drops and gets stabilized at the series division voltage values of the first and the second EM effect electric loads 101, 103, the amperage drops to where equal to the difference of DC source voltage less the voltage VF of the diode 200_in the same direction to be divided by the series resistance value of the first and the second EM effect electric loads 101, 103.

(3) With the source switch 100 is OFF or during transient drop of source voltage, the first capacitor 102 discharges the first resistance 105 and the second EM effect electric load 103; and the second capacitor 104 discharges the second resistance 106 and the first EM effect electric load 101 to delay the time for circuit breaking.

The circuit installation allowing full voltage activation, division voltage operation and delayed breaking while having both EM effect electric loads to serve as electric loads may also have an impedance 301 serving as a resistance electric load for voltage drop thus to drive the single EM effect electric load 103.

Figure 3:
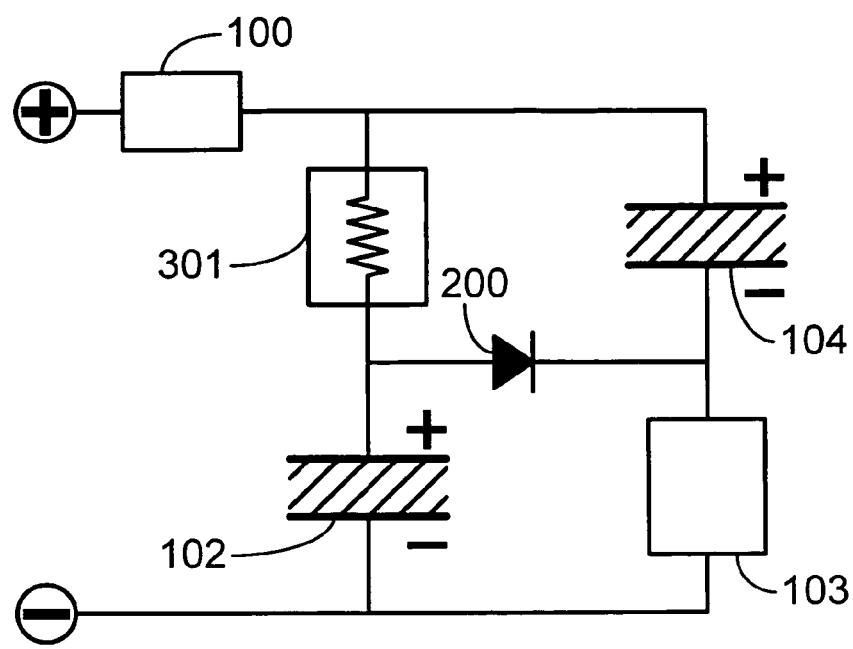
FIG. 3 is a schematic view showing a circuit of electric load in the present invention comprised of resistance and EM effect electric load.

FIG. 3 shows that a circuit of electric load in another preferred embodiment yet of the present invention is comprised of an impedance and EM effect electric load. The third preferred embodiment is comprised of:

the EM effect electric load 103, related to an electric drive installation giving various features depending on the voltage, e.g., an EM effect installation or an installation converting EM force into mechanical energy;

the impedance 301, comprised of resistance impedance, or any coils containing resistance impedance, or power driven installation or device containing resistance impedance;

the impedance 301, provided for connecting the first capacitor 102 in series indicating the same direction of polarity to constitute a first series circuit;

a second capacitor 104, provided to constitute a second series circuit by connecting in series with the EM effect electric load 103 in the same direction of polarity;

both of the first and the second series circuits are connected to each other in parallel indicating the same polarity to be subject to control by a source switch 100; and the diode 200, coupled to where between the coupling point of the impedance 301 and the first capacitor 102 in the first series circuit and that of the EM effect electric load 103 and the second capacitor 104 in the second series circuit and indicating series in the same direction of polarity with the impedance 301 and the EM effect electric loads 103 to permit flow of DC power.

The operational function of the preferred embodiment illustrated in FIG. 3 involves:

(1) With the source switch 100 is ON, DC power charges the first capacitor 102 via the impedance 301 and charges the second capacitor 104 via the EM effect electric load 103; meanwhile, both of the impedance 301 and the EM effect electric load 103 are subject to 100% voltage and the voltage gradually drops at the impedance 301 and the EM effect electric load 103 due to that the charging voltage respectively at the first and the second capacitors 102, 104 indicates integral curve rising status.

(2) When the voltage of the electric load drops and gets stabilized at the series division voltage values of the impedance 301 and the EM effect electric load 103, the amperage drops to where equal to the difference of DC source voltage less the voltage VF of the diode 200 in the same direction to be divided by the series resistance value of the impedance 301 and the EM effect electric load 103.

(3) With the source switch 100 is OFF or during transient drop of source voltage, the first capacitor 102 discharges the EM effect electric load 103; and the second capacitor 104 discharges the impedance 301 to delay the time for circuit breaking.

In the circuit illustrated in FIG. 3, the time of voltage drop at the EM effect electric load 103 and the impedance 301 in the course of discharging, or the time of extended time when the power is interrupted may have its time constant regulated by having both ends of the first and the second capacitors 102, 104 to respectively connect in parallel with a first and a second resistances 105, 106.

Figure 4:
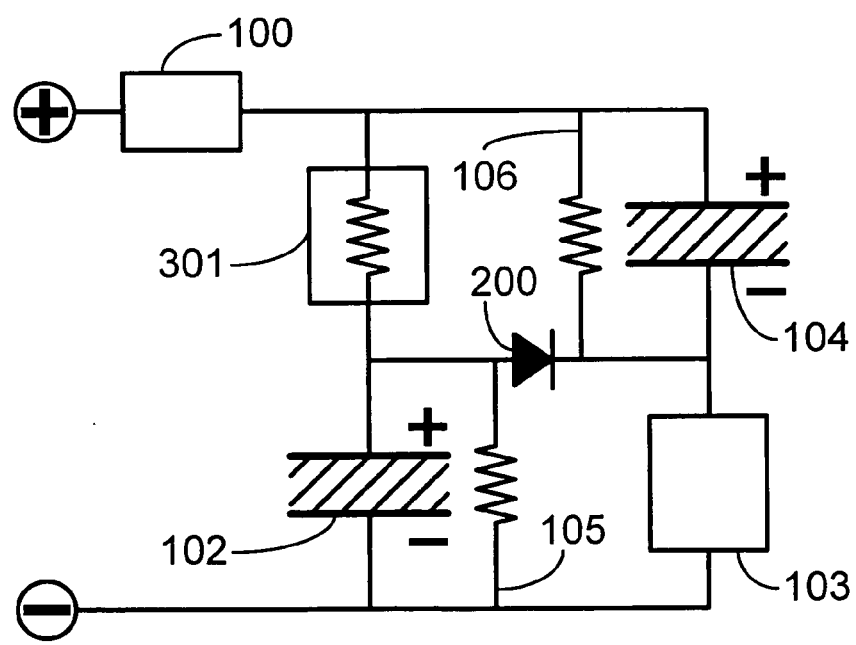
FIG. 4 is a schematic view showing that the circuit of the present invention in FIG. 3 is provided with additional resistance.

FIG. 4 shows another preferred embodiment yet of the present invention with an additional resistance added to the circuit of the preferred embodiment illustrated in FIG. 3. The preferred embodiment illustrated in FIG. 4 is comprised of:

the EM effect electric load 103, related to an electric drive installation giving various features depending on the voltage, e.g., an EM effect installation or an installation converting EM force into mechanical energy;

the impedance 301, comprised of resistance impedance, or any coils containing resistance impedance, or power driven installation or device containing resistance impedance;

the impedance 301, provided for connecting the first capacitor 102 in series indicating the same direction of polarity to constitute a first series circuit;

a second capacitor 104, provided to constitute a second series circuit by connecting in series with the EM effect electric load 103 in the same direction of polarity;

both of the first and the second series circuits are connected in parallel of the same polarity to be subject to control by a source switch 100; and the diode 200, coupled to where between the coupling point of the impedance 301 and the first EM effect electric load 101 in the first series circuit and that of the EM effect electric load 103 and the second capacitor 104 in the second series circuit and indicating series in the same direction of polarity with the impedance 301 and the EM effect electric load 103 to permit flow of DC power;

the first resistance 105, comprised of resistance impedance, or any coils containing resistance impedance, or power driven installation or device containing resistance impedance; connected in parallel with both ends of the first capacitor 102 to facilitate the discharging rate at the first capacitor 102 when the division voltage at the second EM effect electric load 103 drops or is interrupted; and the second resistance 106, comprised of resistance impedance, or any coils containing resistance impedance, or power driven installation or device containing resistance impedance; connected in parallel with both ends of the second capacitor 104 to facilitate the discharging rate at the second capacitor 104 when the division voltage at impedance 301 drops or is interrupted; the second resistance 106 may or may not be provided depending on the characteristics of the resistance 301 connected in parallel.

The operational function of the preferred embodiment illustrated in FIG. 4 involves:

(1) With the source switch 100 is ON, DC power charges the first capacitor 102 via the impedance 301 and charges the second capacitor 104 via the EM effect electric load 103; meanwhile, both of the impedance 301 and the EM effect electric load 103 are subject to 100% voltage and the voltage gradually drops at the impedance 301 and the EM effect electric load 103 due to that the charging voltage respectively at the first and the second capacitors 102, 104 indicates integral curve rising status; the first resistance 105 connected in parallel with the first capacitor 102 and the second resistance 106 connected in parallel with the second capacitor 104 extend the time of voltage drop respectively at the impedance 301 and the EM effect electric load 103.

(2) When the voltage of the electric load drops and gets stabilized at the series division voltage values of the impedance 301 and the EM effect electric load 103, the amperage drops to where equal to the difference of DC source voltage less the voltage VF of the diode 200_in the same direction to be divided by the series resistance value of the impedance 301 and the EM effect electric load 103.

(3) With the source switch 100 is OFF or during transient drop of source voltage, the first capacitor 102 discharges the first resistance 105 and the EM effect electric load 103; and the second capacitor 104 discharges the second resistance 106 and the impedance 301 to delay the time for circuit breaking.

The circuit installation allowing full voltage activation, division voltage operation and delayed breaking may have the electric load comprised of the impedance 301 and another impedance 303.

Figure 5:
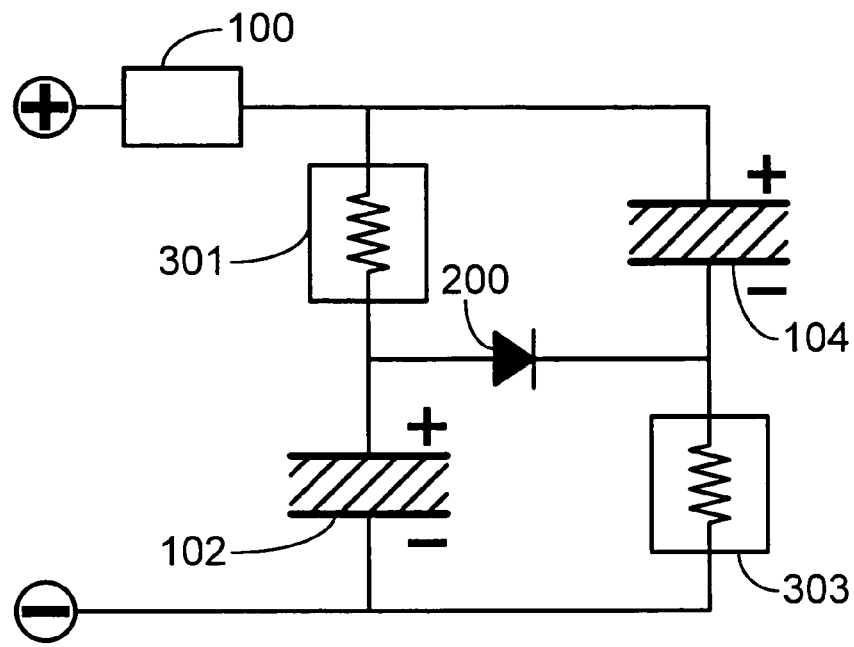
FIG. 5 is a schematic view showing a circuit of electric load in the present invention comprised of resistance.

FIG. 5 is a schematic view showing a circuit of the present invention with an electric load comprised of impedance. In the preferred embodiment illustrated in FIG. 5 is comprised of:

the impedance 301 and 303, each comprised of resistance impedance, or any coils containing resistance impedance, or power driven installation or device containing resistance impedance; both may be comprised of the same or different types with their resistance values may be of the same or not;

the impedance 301, provided for connecting the first capacitor 102 in series indicating the same direction of polarity to constitute a first series circuit;

the second capacitor 104, provided for connecting the impedance 303 in series indicating the same direction of polarity to constitute a second series circuit;

both of the first and the second series circuits are connected in parallel of the same polarity to be subject to control by a source switch 100; and the diode 200, coupled to where between the coupling point of the impedance 301 and the first capacitor 102 in the first series circuit and that of the impedance 303 and the second capacitor 104 in the second series circuit and indicating series in the same direction of polarity with the impedance 301 and another impedance 303 to permit flow of DC power.

The preferred embodiment illustrated in FIG. 5 operates as follows:

(1) With the source switch 100 is ON, DC power charges the first capacitor 102 via the impedance 301 and charges the second capacitor 104 via the second impedance 303; meanwhile, both of the impedance 301 and the second impedance 303 are subject to 100% voltage and the voltage gradually drops at the impedance 301 and the second impedance 303 due to that the charging voltage respectively at the first and the second impedances 301, 303 indicates integral curve rising status.

(2) When the voltage of the electric load drops and gets stabilized at the series division voltage values of the impedance 301 and the second impedance 303, the amperage drops to where equal to the difference of DC source voltage less the voltage VF of the diode 200 in the same direction to be divided by the series resistance value of the impedance 301 and the second impedance 303.

(3) With the source switch 100 is OFF or during transient drop of source voltage, the first capacitor 102 discharges the first impedance 301; and the second capacitor 104 discharges the second impedance 303 to delay the time for circuit breaking.

In the circuit illustrated in FIG. 5, the time of voltage drop at the impedance 301 and 303 in the course of discharging, or the time of extended time when the power is interrupted may have its time constant regulated by having both ends of the first and the second capacitors 102, 104 to respectively connect in parallel with a first and a second resistances 105, 106.

Figure 6:
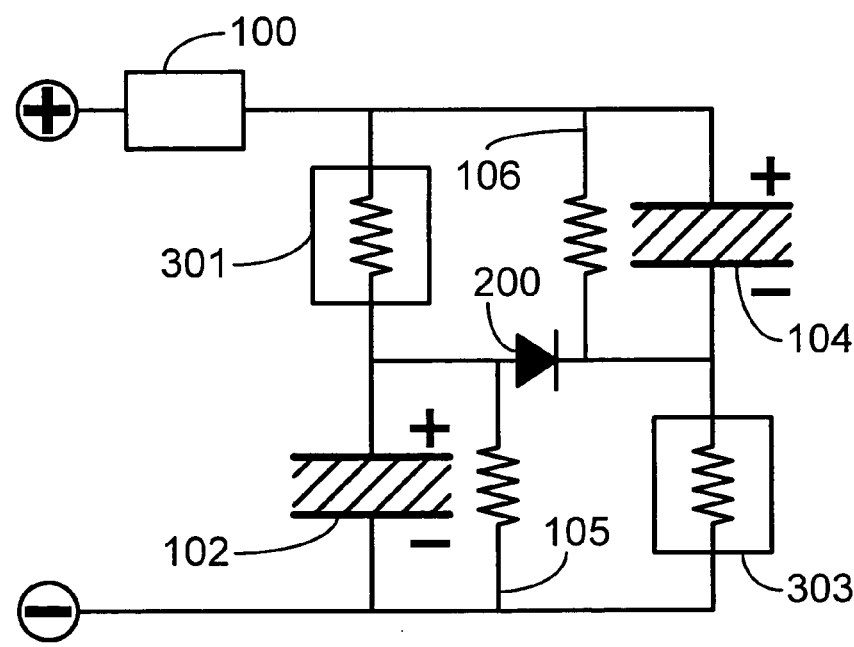
FIG. 6 is a schematic view showing that the circuit of the present invention in FIG. 5 is provided with additional resistance.

The circuit of another preferred embodiment yet of the present invention as illustrated in FIG. 6 provided with additional resistance is comprised of:

the impedance 301 and 303, each comprised of resistance impedance, or any coils containing resistance impedance, or power driven installation or device containing resistance impedance; both may be comprised of the same or different types with their resistance values may be of the same or not;

the impedance 301, provided for connecting the first capacitor 102 in series indicating the same direction of polarity to constitute a first series circuit;

the second capacitor 104, provided for connecting the impedance 303 in series indicating the same direction of polarity to constitute a second series circuit;

both of the first and the second series circuits are connected in parallel of the same polarity to be subject to control by a source switch 100;

the diode 200, coupled to where between the coupling point of the impedance 301 and the first capacitor 102 in the first series circuit and that of the impedance 303 and the second capacitor 104 in the second series circuit and indicating series in the same direction of polarity with the impedance 301 and another impedance 303 to permit flow of DC power;

the first resistance 105, comprised of resistance impedance, or any coils containing resistance impedance, or power driven installation or device containing resistance impedance; connected in parallel with both ends of the first capacitor 102 to facilitate the discharging rate at the first capacitor 102 when the division voltage at the impedance 303 drops or is interrupted; and the first resistance 105 may or may not be provided depending on the characteristics of the resistance 303 connected in parallel;

the second resistance 106, comprised of resistance impedance, or any coils containing resistance impedance, or power driven installation or device containing resistance impedance; connected in parallel with both ends of the second capacitor 104 to facilitate the discharging rate at the second capacitor 104 when the division voltage at impedance 301 drops or is interrupted; and the second resistance 106 may or may not be provided depending on the characteristics of the resistance 301 connected in parallel.

The preferred embodiment of the present invention operates as follows:

(1) With the source switch 100 is ON, DC power charges the first capacitor 102 via the impedance 301 and charges the second capacitor 104 via the second impedance 303; meanwhile, both of the impedance 301 and the second impedance 303 are subject to 100% voltage and the voltage gradually drops at the impedance 301 and the second impedance 303 due to that the charging voltage respectively at the first and the second impedances 301, 303 indicates integral curve rising status; and the first resistance 105 connected in parallel with the first capacitor 102 as well as the second resistance 106 connected in parallel with the second capacitor 106 are capable of extending the voltage drop time respectively for the impedance 301 and the second EM effect electric load 103.

(2) When the voltage of the electric load drops and gets stabilized at the series division voltage values of the impedance 301 and the second impedance 303, the amperage drops to where equal to the difference of DC source voltage less the voltage VF of the diode 200 in the same direction to be divided by the series resistance value of the impedance 301 and the second impedance 303.

(3) With the source switch 100 is OFF or during transient drop of source voltage, the first capacitor 102 discharges the first impedance 301; and the second capacitor 104 discharges the second impedance 303 to delay the time for circuit breaking The electric load selected in practice for the circuit installation of the present invention allowing full voltage activation, division voltage operation, and delayed breaking may be related to a power driven load providing various of characteristics by voltage, e.g., (1) EM effect applied installation provided with excitement coil including EM breaking installation, relay, EM clutch, EM switch, solenoid, EM iron, EM lock, spiral coil, etc., (2) motor, (3) excitement winding of a power generator, (4) impedance including resistance impedance, coil containing resistance impedance, or power drive installation or device containing resistance impedance; and (5) other power driven installation provided with various features by voltage. One or a plurality of same or different power driven installation may be selected from those loads described above to constitute an electric load.

In summary, the circuit configuration disclosed in the present invention for allowing full voltage activation, division voltage operation, and delayed breaking gives precise function and innovative creativity; therefore, this application for patent is duly filed accordingly.

The invention claimed is:

1. A delayed braking circuit comprising:
   a first series circuit comprising a first electric load connected in series with a first capacitor in the same direction of polarity;
   a second series circuit comprising a second capacitor connected in series with a second electric load in the same direction of polarity;
   both first and second capacitors and both first and second electric loads in the first and second series circuits are connected in series in opposite sequence before being connected in parallel and in which the same polarity is controlled by a source switch; and
   a diode coupled to a coupling point of the first electric load and the first capacitor in the first series circuit and that of the second electric load and the second capacitor in the second series circuit and in series in the same direction of polarity with the first and second electric loads for flow of DC power;
   wherein the DC power charges both first and second capacitors connected in series via the first and second electric loads in the first and second series circuits, the first and second electric loads are subjected to 100% voltage and the charging voltage of a first or second capacitor rises to create balanced division voltage respectively, between both first and second electric loads connected in parallel with the first and second capacitor;
   wherein both electric loads in the first and second series circuits have high resistance and low amperage to achieve delayed braking and the electric load includes an EM effect load or resistance load.

2. The delayed braking circuit as claimed in claim 1
   wherein the EM effect electric loads are an EM effect installation or an installation converting EM force into mechanical energy depending on the voltage;
   the first EM effect electric load constitutes a first series circuit through series connection with the first capacitor in the same direction of polarity;
   the second capacitor constitutes a second series circuit through series connection with the second EM effect electric load in the same direction of polarity;
   both capacitors and both EM effect electric loads in the first and the second series circuits are connected in series in opposite sequence before being connected in parallel and are controlled by a source switch.

3. The delayed braking circuit as claimed in claim 2, wherein the circuit operates as follows:
   (1) with the source switch ON, DC power charges the first capacitor via the first EM effect electric load and charges the second capacitor via the second EM effect electric load; wherein both of the first and the second EM effect electric loads are subject to 100% voltage and the voltage gradually drops at each of the first and second EM effect electric loads because of the charging voltage respectively at the first and the second capacitors which indicates integral curve rising status;

(2) when the voltage of an electric load drops and gets stabilized at series division voltage values of the first and the second EM effect electric loads the amperage drops becoming equal to the difference of DC source voltage less a voltage VF of the diode in the same direction to be divided by a series resistance value of the first and the second EM effect electric loads;

(3) with the source switch OFF or during transient drop of source voltage, the first capacitor discharges the second EM effect electric load and the second capacitor discharges the first EM effect electric load to delay the time for circuit braking.

4. The delayed braking circuit as claimed in claim 1, wherein the electric load is selected from an (1) EM effect applied installation provided with an excitement coil including EM braking installation, relay, EM clutch, EM switch, solenoid, solenoid, EM iron, EM lock, (2) winding of motor, (3) winding of a power generator, and (4) other power driven installation and one or a plurality of the same or different power driven installation driven installation selected from those loads described above to constitute an electric load.

5. The delayed breaking circuit as claimed in claim 1, wherein the first and second electric loads are active devices.

* * * * *